US008836360B2

(12) United States Patent
Oh

(10) Patent No.: US 8,836,360 B2
(45) Date of Patent: Sep. 16, 2014

(54) SEMICONDUCTOR DEVICE INCLUDING INTEGRATED CIRCUIT

(75) Inventor: Young-ju Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 281 days.

(21) Appl. No.: 13/240,747

(22) Filed: Sep. 22, 2011

(65) Prior Publication Data

US 2012/0139568 A1 Jun. 7, 2012

(30) Foreign Application Priority Data

Dec. 1, 2010 (KR) .................. 10-2010-0121332

(51) Int. Cl.
 *G01R 31/00* (2006.01)
 *G01R 31/317* (2006.01)
 *G01R 31/28* (2006.01)

(52) U.S. Cl.
 CPC ...... *G01R 31/2844* (2013.01); *G01R 31/31704* (2013.01)
 USPC .............. 324/750.3; 324/762.01; 324/762.06; 365/201; 365/230.02; 714/718; 714/724

(58) Field of Classification Search
 CPC .................. G01R 31/31702; G01R 31/31723; G01R 31/2644; G01R 31/2642; G11C 29/12; G11C 29/48; G11C 29/54
 See application file for complete search history.

(56) References Cited

U.S. PATENT DOCUMENTS

| 6,151,272 | A | 11/2000 | La et al. | |
|---|---|---|---|---|
| 6,466,053 | B2 * | 10/2002 | Duesman | 326/47 |
| 7,529,318 | B2 * | 5/2009 | Huber | 375/316 |
| 7,593,271 | B2 * | 9/2009 | Ong | 365/189.03 |
| 7,642,803 | B2 * | 1/2010 | Choi | 324/750.3 |
| 7,668,025 | B2 * | 2/2010 | Kim | 365/193 |
| 7,821,851 | B2 * | 10/2010 | Kim | 365/191 |
| 7,853,840 | B2 | 12/2010 | Park et al. | |
| 8,327,199 | B1 * | 12/2012 | Dastidar et al. | 714/724 |
| 2008/0091979 | A1 * | 4/2008 | Okuda | 714/42 |
| 2008/0195904 | A1 * | 8/2008 | Wang | 714/726 |
| 2008/0288835 | A1 | 11/2008 | Ruf et al. | |
| 2009/0296444 | A1 * | 12/2009 | Yeh | 365/51 |

FOREIGN PATENT DOCUMENTS

| JP | 2008-293652 | 12/2008 |
|---|---|---|
| KR | 2000-0008823 | 2/2000 |
| KR | 10-0763248 | 9/2007 |

* cited by examiner

*Primary Examiner* — Huy Q Phan
*Assistant Examiner* — James Split
(74) *Attorney, Agent, or Firm* — Onello & Mello, LLP

(57) ABSTRACT

A semiconductor device that can be manufactured with reduced costs and that includes a first connecting terminal, a second connecting terminal, a third connecting terminal, and a first circuit module configured to operate in response a first signal and a second signal. When a mode signal is in a first state, the first circuit module receives the first signal from the first connecting terminal and receives the second signal from the second connecting terminal. Otherwise, when the mode signal is in a second state, the first circuit module receives the first signal from the first connecting terminal and receives the second signal from the third connecting terminal. A memory module including at least one such memory device may also be provided.

18 Claims, 11 Drawing Sheets

FIG. 3

| CONNECTING TERMINAL | CLK↑ | CLK↓ |
|---|---|---|
| FIRST CONNECTING TERMINAL | S1 | S3 |
| SECOND CONNECTING TERMINAL | S2 | S4 |
| THIRD CONNECTING TERMINAL | | |

FIG. 4

| CONNECTING TERMINAL | CLK↑ | CLK↓ |
|---|---|---|
| FIRST CONNECTING TERMINAL | S1 | S3 |
| SECOND CONNECTING TERMINAL | | S4 |
| THIRD CONNECTING TERMINAL | S2 | |

| OPERATION | CA0 | CA1 | CA2 | CA3 | CA4 | CA5 | CA6 | CA7 | CA7 | CA9 | Clock Edge |
|---|---|---|---|---|---|---|---|---|---|---|---|
| MRW | L | L | L | L | MA0 | MA1 | MA2 | MA3 | MA4 | MA5 | ↑ |
|  | NA6 | NA7 | OP0 | OP1 | OP2 | OP3 | OP4 | OP5 | OP6 | OP7 | ↓ |
| MRR | L | L | L | H | MA0 | MA1 | MA2 | MA3 | MA4 | MA5 | ↑ |
|  | MA6 | MA7 |  |  |  |  |  |  |  |  | ↓ |
| REFRESH | L | L | H | H |  |  |  |  |  |  | ↑ ↓ |
| SELF REFRESH | L | L | H |  |  |  |  |  |  |  | ↑ ↓ |
| ACTIVE | L | H | R8 | R9 | R10 | R11 | R12 | BA0 | BA1 | BA2 | ↑ |
|  | R0 | R1 | R2 | R3 | R4 | R5 | R6 | R7 | R13 | R14 | ↓ |
| WRITE | H | L | L | C0 | RFU | C1 | C2 | BA0 | BA1 | BA2 | ↑ |
|  | AP | C3 | C4 | C5 | C6 | C7 | C8 | C9 | C10 | C11 | ↓ |
| READ | H | L | H | C0 | RFU | C1 | C2 | BA0 | BA1 | BA2 | ↑ |
|  | AP | C3 | C4 | C5 | C6 | C7 | C8 | C9 | C10 | C11 | ↓ |
| PRECHARGE | H | H | L | H | A8 |  |  | BA0 | BA1 | BA2 | ↑ ↓ |
| BST | H | H | L | L |  |  |  |  |  |  | ↑ ↓ |
| DPD | H | H | L |  |  |  |  |  |  |  | ↑ ↓ |
| NOP | H | H | H |  |  |  |  |  |  |  | ↑ ↓ |

FIG. 8

|  | CLK↑ | CLK↓ | CLK↑ | CLK↓ | CLK↑ | CLK↓ |
|---|---|---|---|---|---|---|
| CA0 | L/H | R0 | L/H | AP | L/H | MA6 |
| CA1 | L/H | R1 | L/H | C3 | L/H | MA7 |
| CA2 | R8 | R2 | L/H | C4 | L/H | OP0 |
| CA3 | R9 | R3 | C0 | C5 | L/H | OP1 |
| CA3 | R10 | R4 | RFU/AB | C6 | MA0 | OP2 |
| CA5 | R11 | R5 | C1 | C7 | MA1 | OP3 |
| CA6 | R12 | R6 | C2 | C8 | MA2 | OP4 |
| CA7 | BA0 | R7 | BA0 | C9 | MA3 | OP5 |
| CA8 | BA1 | R13 | BA1 | C10 | MA4 | OP6 |
| CA9 | BA2 | R14 | BA1 | C11 | MA5 | OP7 |

FIG. 9

|      | CLK↑ | CLK↓ | CLK↑   | CLK↓ | CLK↑ | CLK↓ |
|------|------|------|--------|------|------|------|
| CA0  | L/H  | R0   | L/H    | AP   | L/H  | MA6  |
| CA1  | L/H  | R1   | L/H    | C3   | L/H  | MA7  |
| CA2  | R8   | R2   |        | C4   |      | OP0  |
| CA3  | R9   | R3   | C0     | C5   |      | OP1  |
| CA3  | R10  | R4   | RFU/AB | C6   | MA0  | OP2  |
| CA5  | R11  | R5   | C1     | C7   | MA1  | OP3  |
| CA6  | R12  | R6   | C2     | C8   | MA2  | OP4  |
| CA7  | BA0  | R7   | BA0    | C9   | MA3  | OP5  |
| CA8  | BA1  | R13  | BA1    | C10  | MA4  | OP6  |
| CA9  | BA2  | R14  | BA1    | C11  | MA5  | OP7  |
| DQS0 |      |      | L/H    |      | L/H  |      |
| DQS0B|      |      |        |      | L/H  |      |

FIG. 10

|  | CLK↑ | CLK↓ | CLK↑ | CLK↓ | CLK↑ | CLK↓ |
|---|---|---|---|---|---|---|
| CA1 | S1(L/H) | S3(R1) | S1(L/H) | S3(C3) | S1(L/H) | S3(MA) |
| CA2 | S4(R8) | S4(R2) | S2(L/H) | S4(C4) | S2(L/H) | S4(MA) |

FIG. 11

|  | CLK↑ | CLK↓ | CLK↑ | CLK↓ | CLK↑ | CLK↓ |
|---|---|---|---|---|---|---|
| CA1 | S1(L/H) | S3(R1) | S1(L/H) | S3(C3) | S1(L/H) | S3(MA7) |
| CA2 | S4(R8) | S4(R2) |  | S4(C4) |  |  |
| DQS0 |  |  | S2(L/H) |  | S2(L/H) |  |

SEMICONDUCTOR DEVICE INCLUDING INTEGRATED CIRCUIT

CROSS-REFERENCE TO RELATED APPLICATIONS

This application claims the benefit, under 35 U.S.C. §119, to Korean Patent Application No. 10-2010-0121332, filed on Dec. 1, 2010, in the Korean Intellectual Property Office, the disclosure of which is incorporated herein in its entirety by reference.

FIELD OF INVENTION

The inventive concept relates to a semiconductor device, and more particularly, to a semiconductor device including an integrated circuit.

BACKGROUND

A semiconductor device, after having been manufactured using a predetermined assembling process, undergoes a test for checking whether the semiconductor device satisfies a specific function or set of functions. That is, the device is tested to determine whether or not it operates according to its specifications. A typical manner of performing such test utilizes a tester that applies an input signal or signals to the semiconductor device, receives an output signal or signals from the semiconductor device, and compares the input and output signals with expected data.

If the results of the comparison were not as expected according to the specification for the semiconductor device, the semiconductor device may be considered to have "failed" the test. On the other hand, if the results of the comparison were as expected according to the specification for the semiconductor device, the semiconductor device may be considered to have "passed" the test.

SUMMARY

In accordance with various aspects of the inventive concept, there is provided a semiconductor device including an integrated circuit and a selective distribution of signals to perform a test that enables use of a conventional tester, which would not otherwise have been useful without such selective distribution of signals.

According to an aspect of the inventive concept, there is provided a semiconductor device including a first connecting terminal, a second connecting terminal, a third connecting terminal, and a first circuit module configured to operate in response to a first signal and a second signal. A signal distribution unit is also provided that is configured to transmit the first signal from the first connecting terminal to the first circuit module and the second signal from the second connecting terminal to the first circuit module when a mode signal is in a first state. The signal distribution unit is also configured to transmit the first signal from the first connecting terminal to the first circuit module and the second signal from the third connecting terminal to the first circuit module when the mode signal is in a second state.

The semiconductor device can be configured to be tested by a tester having an ability to assign N pin data to each connecting terminal, and a number of signals applied to the second connecting terminal during the application of the mode signal is 1 through N.

The first circuit module may be a command decoder configured to operate in response to a command signal including the first signal and the second signal.

The command decoder may be configured to operate in response to the command signal when received from the first connecting terminal and the second connecting terminal when the mode signal is in a first state and to operate in response to the command signal when received from the first connecting terminal and the third connecting terminal when the mode signal is in a second state.

The semiconductor device may further include a second circuit module configured to operate in response to a plurality of signals from the first connecting terminal and the second connecting terminal.

The semiconductor device can be configured to be tested by a tester having an ability to assign N terminal data to each connecting terminal during application of the mode signal, and a number of signals applied by the second connecting terminal from among the plurality of signals is 1 through N.

The second circuit module may be an address decoder configured to operate in response to an address signal including the plurality of signals.

The signal distribution unit may be configured to electrically connect the first connecting terminal, the second connecting terminal, and the first circuit module when a mode signal is in a first state, and electrically connect the third connecting terminal and the first circuit module when the mode signal is in a second state.

The first signal and the second signal may comprise a first operating signal of the first circuit module, and can be synchronized with a clock signal applied to the first circuit module.

The first signal and the second signal may be synchronized with a rising edge and a falling edge of the clock signal applied to the first circuit module.

According to another aspect of the inventive concept, there is provided a memory module including a plurality of semiconductor devices including at least one semiconductor device. The at least one semiconductor device comprises a first connecting terminal, a second connecting terminal, a third connecting terminal, a first circuit module configured to operate in response to a first signal and a second signal, and a signal distribution unit configured to transmit signals received from the first connecting terminal, the second connecting terminal, and the third connecting terminal to the first circuit module. The signal distribution unit is further configured to electrically connect the second connecting terminal and the first circuit module when a mode signal is in a first state, and electrically connect the third connecting terminal and the first circuit module when the mode signal is in a second state The first circuit module may be a command decoder configured to operate in response to a command signal including the first signal and the second signal.

The semiconductor device may further include an address decoder configured to operate in response to an address signal from the first connecting terminal and the second connecting terminal.

When the mode signal is in a first state, the command decoder may be configured to operate in response to the command signal when received from the first connecting terminal and the second connecting terminal, and when the mode signal is in a second state, the command decoder may be configured to operate in response to the command signal when received from the first connecting terminal and the third connecting terminal.

According to another aspect of the inventive concept, there is provided a semiconductor device including: a first CA pin; a second CA pin; a DQS pin; an address decoder configured to operate in response to an address signal; and a command decoder configured to operate in response to a command signal. The address decoder is configured to operate in response to the address signal from the first CA pin and the second CA pin. And the command decoder is configured to operate in response to the command signal from the first CA pin and the second CA pin when a mode signal is in a first state, and to operate in response to the command signal from the first CA pin and the DQS pin when the mode signal is in a second state.

The command signal may include a first signal and a second signal, and the command decoder may be configured to operate in response to the first signal from the first CA pin and the second signals from the second CA pin when the mode signal is in a first state, and to operate in response to the first signal from the first CA pin and the second signal from the DQS pin when the mode signal is in a second state.

The address signal and the command signal may be generated by a tester.

A number of pin data for each pin assigned by the tester may be higher than a number of signals applied to the second CA pin when the mode signal is in a second state.

A number of pin data for each pin assigned by the tester may be higher than a number of signals applied to the second CA pin of the address signal when the mode signal is in a second state.

According to another aspect of the inventive concept, there is provided a semiconductor device including: a plurality of first connecting terminals; one or more second connecting terminals; and a first circuit module configured to operate in response to a first signal and a second signal. The first circuit module is configured to operate in response to the first signal and the second signal from the plurality of first connecting terminals when a mode signal is in a first state, wherein the first signal is received from the plurality of first connecting terminals and the second signal is received from the second connecting terminal.

In accordance with one aspect of the inventive concept, provided is a method of distributing test signals in a semiconductor device. The method comprises providing a semiconductor device including a first connecting terminal, a second connecting terminal, a third connecting terminal, a first circuit module, and a second circuit module. The method also includes, when a mode signal is in a first state, transmitting a first signal from the first connecting terminal to the first circuit module and a second signal from the second connecting terminal to the first circuit module, and when the mode signal is in a second state, transmitting the first signal from the first connecting terminal to the first circuit module and the second signal from the third connecting terminal to the first circuit module.

The first signal and the second signal can include a first operating signal of the first circuit module, and the method can include synchronizing the first signal and the second signal with a clock signal applied to the first circuit module.

The method can further comprise synchronizing the first signal and the second signal with a rising edge and a falling edge of the clock signal applied to the first circuit module.

The method can further comprise testing the semiconductor device using a tester, including the tester assigning N pin data to each connecting terminal, and applying 1 through N signals to the second connecting terminal during the application of the mode signal.

The first circuit module can be a command decoder configured to operate in response to a command signal including the first signal and the second signal.

The method can further comprise providing the semiconductor device with a second circuit module configured to operate in response to a plurality of signals from the first connecting terminal and the second connecting terminal, wherein the second circuit module comprises an address decoder configured to operate in response to an address signal comprising a plurality of signals. The method can also include testing the semiconductor device using a tester, including, the tester assigning N terminal data to each connecting terminal during application of the mode signal, and applying 1 through N signals from among the plurality of signals to the second connecting terminal.

BRIEF DESCRIPTION OF THE DRAWINGS

The inventive concept will be more clearly understood from exemplary embodiments disclosed in the following detailed description taken in conjunction with the accompanying drawings, in which:

FIGS. 3 and 4 are tables showing signals applied to each connecting terminal of the semiconductor devices of FIGS. 1 and 2 according to an applied clock signal, according to aspects of the inventive concept;

FIGS. 8 and 9 are embodiments of tables showing signals synchronized with a clock signal for each pin according to whether a mode signal is applied, according to aspects of the inventive concept;

FIGS. 10 and 11 are embodiments of tables showing signals applied to a first CA pin, a second CA pin, and a DQS0 pin from among the pins, according to aspects of the inventive concept;

DETAILED DESCRIPTION OF THE EMBODIMENTS

Exemplary embodiments in accordance with aspects of the invention now will be described more fully hereinafter with reference to the accompanying drawings. This invention may, however, be embodied in many different forms and should not be construed as limited to the embodiments set forth herein. Although a few embodiments have been shown and described, it would be appreciated by those skilled in the art that changes may be made in these exemplary embodiments without departing from the principles and spirit of the invention, the scope of which is defined in the claims and their equivalents.

The terminology used herein is for the purpose of describing particular embodiments only and is not intended to be limiting of the invention. As used herein, the singular forms "a", "an" and "the" are intended to include the plural foams as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

Figure 1:
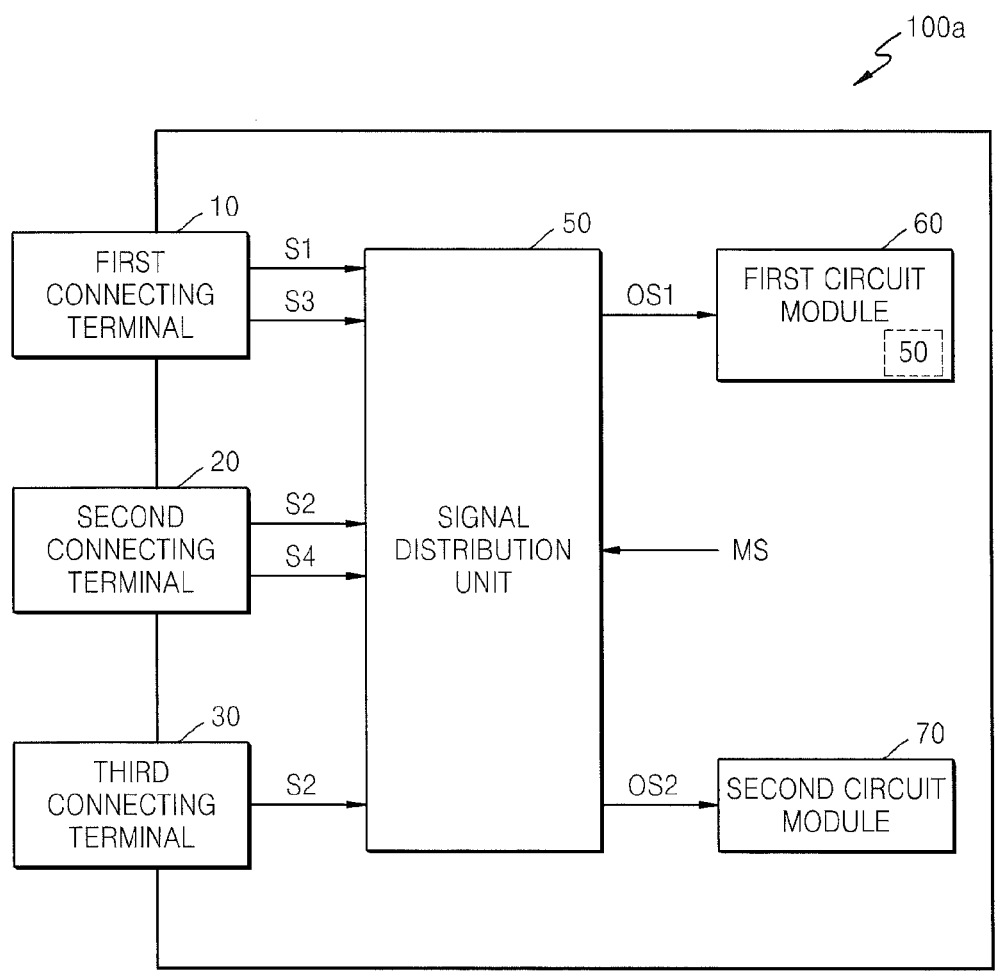
FIG. 1 is a schematic block diagram of an exemplary embodiment of a semiconductor device, according to aspects of the inventive concept.
Figure 2:
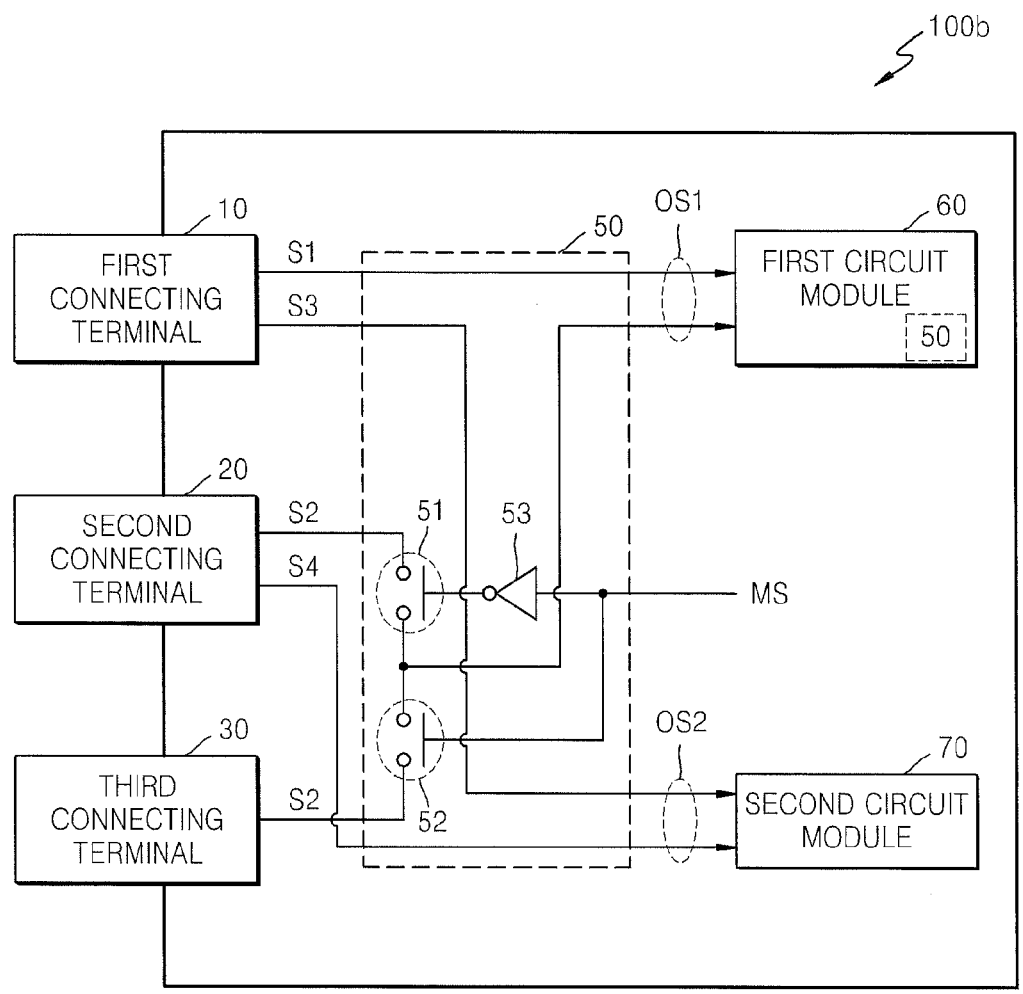
FIG. 2 is a block diagram of an exemplary embodiment of the semiconductor device of FIG. 1 including a signal distribution unit of FIG. 1, according to aspects of the inventive concept.

FIG. 1 is a schematic block diagram showing an exemplary embodiment of a semiconductor device 100a, according to aspects of the inventive concept. FIG. 2 is a block diagram showing an exemplary embodiment of a semiconductor device 100b including a signal distribution unit 50 of FIG. 1 therein. The semiconductor device 100b of FIG. 2 may be the same as the semiconductor device 100a of FIG. 1, but with more detail shown of the signal distribution unit 50 in FIG. 2.

Referring to FIGS. 1 and 2, the semiconductor devices 100a and 100b each may include a first connecting terminal 10, a second connecting terminal 20, a third connecting terminal 30, the signal distribution unit 50, a first circuit module 60, and a second circuit module 70.

The first, second, and third connecting terminals 10, 20, and 30 perform a function of delivering a first operating signal OS1 and a second operating signal OS2 required to perform operations of the first circuit module 60 and the second circuit module 70. The first operating signal OS1 and second operating signal OS2 are selectively delivered via the signal distribution unit 50, as discussed below. Although FIG. 1 shows only three connecting terminals 10, 20, and 30, the inventive concept is not limited thereto. That is, a greater number of connecting terminals may be included in the semiconductor devices 100a and 100b, as would be appreciated by those skilled in the art.

The first circuit module 60 and the second circuit module 70 each may be configured to perform a specific function. The first circuit module 60 and the second circuit module 70 may be configured to perform the same function or different functions. The first circuit module 60 and the second circuit module 70 may operate is response to the first operating signal OS1 and the second operating signal OS2, respectively. The first circuit module 60 and the second circuit module 70 may include one or more transistors, passive elements, etc., implemented in a semiconductor chip.

For example, the first circuit module 60 may be a command decoder configured to operate by receiving a command signal comprised of a first signal 51 and a second signal S2, as is shown in FIGS. 1 and 2. In such a case, the command signal is the first operating signal OS1. The second circuit module 70 may be an address decoder configured to operate by receiving an address signal comprised of a third signal S3 and a fourth signal S4. In such a case, the address signal is the second operating signal OS2. Embodiments of the command decoder and the address decoder will be described in more detail with reference to FIG. 5.

In detail, the first operating signal OS1 may include the first signal 51 and the second signal S2. Accordingly, the first circuit module 60 may be configured to operate in response to receiving the first signal S1 and the second signal S2. The second operating signal OS2 may include the third signal S3 and the fourth signal S4. Accordingly, the second circuit module 70 may be configured to operate in response to receiving the third signal S3 and the fourth signal S4.

In this case, the first operating signal OS1 and the second operating signal OS2 may be transmitted by the first connecting terminal 10 and the second connecting terminal 20, respectively. In detail, the first connecting terminal 10 may deliver the first signal S1 and the third signal S3, and the second connecting terminal 20 may deliver the second signal S2 and the fourth signal S4, in this embodiment. Alternatively, the second signal S2 may be transmitted by the third connecting terminal 30, as is shown. That is, the first and third connecting terminals 10, 30 may each be provided and each be configured to provide the second signal S2.

Although FIG. 1 shows only the first circuit module 60 and the second circuit module 70, the inventive concept is not limited thereto. That is, a greater number of circuit modules may be included in the semiconductor devices 100a and 100b. In this case, the first, second, and third connecting terminals 10, 20, and 30 may further deliver signals required to operate the first and second circuit modules 60 and 70.

The signal distribution unit 50 may be configured to control whether the second signal S2 is transmitted to the first circuit module 60 by the second connecting terminal 20 or whether the second signal S2 is transmitted to the first circuit module 60 by the third connecting terminal 30. For example, when a mode signal MS is in a first state, the signal distribution unit 50 may be configured to electrically connect the second connecting terminal 20 and the first circuit module 60. When the mode signal MS is in a second state, the signal distribution unit 50 may be configured to electrically connect the third connecting terminal 30 and the first circuit module 60.

As shown in the embodiment of FIG. 2, when the signal distribution unit 50 is configured as a separate circuit module, the signal distribution unit 50 may be configured to transmit signals received from the first, second, and third connecting terminals 10, 20, and 30 to the first and second circuit modules 60 and 70.

Additionally, the signal distribution unit 50 may electrically connect the first circuit module 60 and the first connecting terminal 10 so as to transmit the first signal S1 from the first connecting terminal 10 to the first circuit module 60.

In detail, when the mode signal MS is in a first state (e.g. a low state), the mode signal MS may turn off a second switch 52 of the signal distribution unit 50, and may turn on a first switch 51 of the signal distribution unit 50 by being inverted by an inverter 53. As a result, the second connecting terminal 20 and the first circuit module 60 may be electrically connected to each other. Alternatively, when the mode signal MS is in a second state (e.g. a high state), the mode signal MS may turn on the second switch 52 of the signal distribution unit 50, and may turn off the first switch 51 of the signal distribution unit 50 by being inverted by the inverter 53. As a result, the third connecting terminal 30 and the first circuit module 60 may be electrically connected to each other.

In short, when the mode signal MS is in a first state, the first circuit module 60 may be configured to operate in response to receiving the first operating signal OS1 from the first and second connecting terminals 10 and 20, and when the mode signal MS is in a second state, the first circuit module 60 may be configured to operate by receiving the first operating signal OS1 from the first and third connecting terminals 10 and 30.

Furthermore, the signal distribution unit 50 may electrically connect the second circuit module 70 and first and second connecting terminals 10 and 20 to respectively transmit the third and fourth signals S3 and S4 from the first and second connecting terminals 10 and 20 to the second circuit module 70. The circuit configuration shown in FIG. 2 is provided merely for illustrative purpose and is not intended to be limiting of the scope of the claims or of the inventive concept.

Although FIG. 2 shows one embodiment in which the signal distribution unit 50 is configured as a separate circuit module, the inventive concept is not limited thereto. That is, the signal distribution unit 50 may be configured as a separate circuit module or may be configured inside the first circuit module 60, as an example. The signal distribution unit 50 may also be formed of more than one circuit in some embodiments.

And in other embodiments, the signal distribution unit 50 may not receive and deliver signals available from only one terminal, such as signals S1, S3, and S4, as examples. For example, the signal distribution unit 50 may be configured to receive and selectively switch signal S2.

When the signal distribution unit 50 is located inside the first circuit module 60, the first circuit module 60 may receive the second signal S2 from the second connecting terminal 20 and the second signal S2 from the third connecting terminal 30. When the mode signal is in a first state the second signal S2 from the second connecting terminal 20 is delivered to the functional elements of the first circuit module 20, e.g., command decoding functionality. And when the mode signal MS is in a second state the second signal S2 from the third connecting terminal 30 is delivered to the functional elements of the first circuit module 20, e.g., command decoding functionality.

When the first circuit module 60 is a command decoder operating by receiving a command signal, the command decoder may receive the command signal from the first and second connecting terminals 10 and 20 when the mode signal MS is in a first state, and may receive the command signal from the first and third connecting terminals 10 and 30 when the mode signal MS is in a second state.

FIGS. 3 and 4 are tables showing signals applied to each connecting terminal of the semiconductor devices 100a and 100b of FIGS. 1 and 2 according to an applied clock signal.

The first through fourth signals S1 through S4 may each include a plurality of bit signals. Although the current embodiment will be described on the premise that each of the first through fourth signals S1 through S4 corresponds to a single bit signal. Accordingly, in the current embodiment, the first operating signal OS1 applied to the first circuit module 60 is a 2-bit signal comprising the first and second signals S1 and S2, and the second operating signal OS2 applied to the second circuit module 70 is a 2-bit signal comprising the third and fourth signals S3 and S4.

Referring to FIGS. 2 through 4, the first through fourth signals S1 through S4 may be synchronized with a clock signal to be applied to the first and second circuit modules 60 and 70. In detail, the first through fourth signals S1 through S4 may be synchronized with a rising edge and a falling edge of the clock signal to be applied to the first and second circuit modules 60 and 70. In the embodiment of FIGS. 3 and 4, first and second signals S1 and S2 are synchronized with the rising edge of the clock signal, as indicated by "CLK ↑". And third and fourth signals S3 and S4 are synchronized with the falling edge of the clock signal, as indicated by "CLK ↓".

Figure 14:
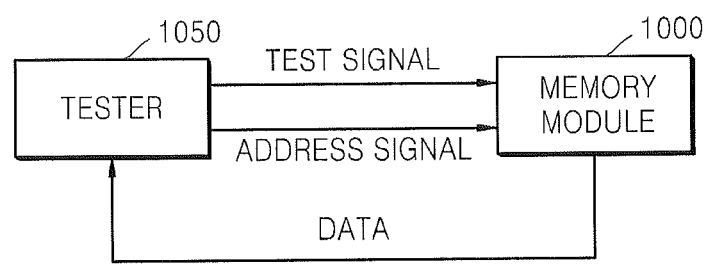
FIG. 14 is a block diagram showing an exemplary embodiment of a functional arrangement for testing a memory module using a tester, according to aspects of the inventive concept.

The first, second, and third connecting terminals 10, 20, and 30 may be electrically connected to a tester (see, e.g., FIG. 14). In this case, the tester may apply signals, for example, the first and second operating signals OS1 and OS2, via the first, second, and third connecting terminals 10, 20, and 30 in order to determine whether components included in the semiconductor devices 100a and 100b, for example, the first and second circuit modules 60 and 70, operate to satisfy one or more predetermined conditions.

For example, FIG. 3 shows a case where the mode signal MS is in a first state. In FIG. 3, the tester may apply the first and third signals S1 and S3 to the first connecting terminal 10, and may apply the second and fourth signals S2 and S4 to the second connecting terminal 20.

In this case, for example, the tester applies two types of signals, that is, the second and fourth signals S2 and S4, which shows that the tester assigns two types of pin data to a single channel and selects and controls the pin data in real time.

Thus, in a circuit configuration in which a mode signal MS is in a first state, when the tester applies the second and fourth signals S2 and S4 to the second connecting terminal 20 in order to test whether the semiconductor devices 100a and 100b operate properly, the tester should assign two types of pin data for each channel, that is, for each connecting terminal. For example, a conventional tester capable of assigning only one pin data may not be used in such a case.

However, in FIG. 4, that is, when a mode signal MS is in a second state, even though the second signal S2 is applied to the third connecting terminal 30, the second signal S2 applied to the third connecting terminal 30 may be transmitted to the first circuit module 60 by the signal distribution unit 50. Thus, a number of signals applied to the second and third connecting terminals 20 and 30 is reduced to one, and a conventional tester capable of assigning only one pin data may be used.

That is, according to the embodiments of the inventive concept, when a mode signal MS is in a second state, a signal related to the first circuit module 60 and applied to the second connecting terminal 20, that is, the second signal S2, may be applied to the third connecting terminal 30, and a signal related to the second circuit module 70, that is, the fourth signal S4, may be applied to the second connecting terminal 20, so that a test of a semiconductor device may be performed by using a conventional tester that is only capable of assigning a small number of pin data.

Although FIGS. 1 through 4 show simple cases where a conventional tester capable of assigning only one pin data may be used when two signals are applied to a connecting terminal, the inventive concept may be further extended and generalized.

That is, for example, the inventive concept may be applied even when the first and second signals S1 and S2, which comprise the first operating signal OS1, each includes a plurality of signals, e.g., a plurality of bit signals, and when the third and fourth signals S3 and S4, which comprise the second operating signal OS2, each includes a plurality of signals, e.g., a plurality of bit signals.

In this case, when the semiconductor devices 100a and 100b can be tested by a conventional tester having an ability to assign a number "N" of pin data for each connecting terminal, a number of signals, that is, a number of bit signals applied to the second connecting terminal 20, may be 1 through N. In other words, the number of signals or bits may be equal to or less than N.

In detail, when a mode signal MS is in a second state, signals related to the first circuit module 60 may be transmitted to the first circuit module 60 via the third connecting terminal 30, and only signals related to the second circuit module 70 may be transmitted to the second circuit module 70 via the second connecting terminal 20. Accordingly, when the semiconductor devices 100a and 100b are tested using the conventional tester having an ability to assign N pin data for each connecting terminal, a number of signals applied to the second connecting terminal 20 from among the second operating signal OS2 for operating the second circuit module 70 may be 1 through N. In other words, the number of signals or bits, may be equal to or less than N.

As such, the semiconductor devices 100a and 100b, according to aspects of the inventive concept, may decode a test signal through an integrated circuit formed therein. Accordingly, even though a conventional tester having a limited ability to assign pin data for each channel is used, a test may be performed by distributing test signals using the signal distribution unit 50 of the integrated circuit. Consequently, there is no need for an additional tester, and thus, cost reduction may be achieved.

Figure 5:
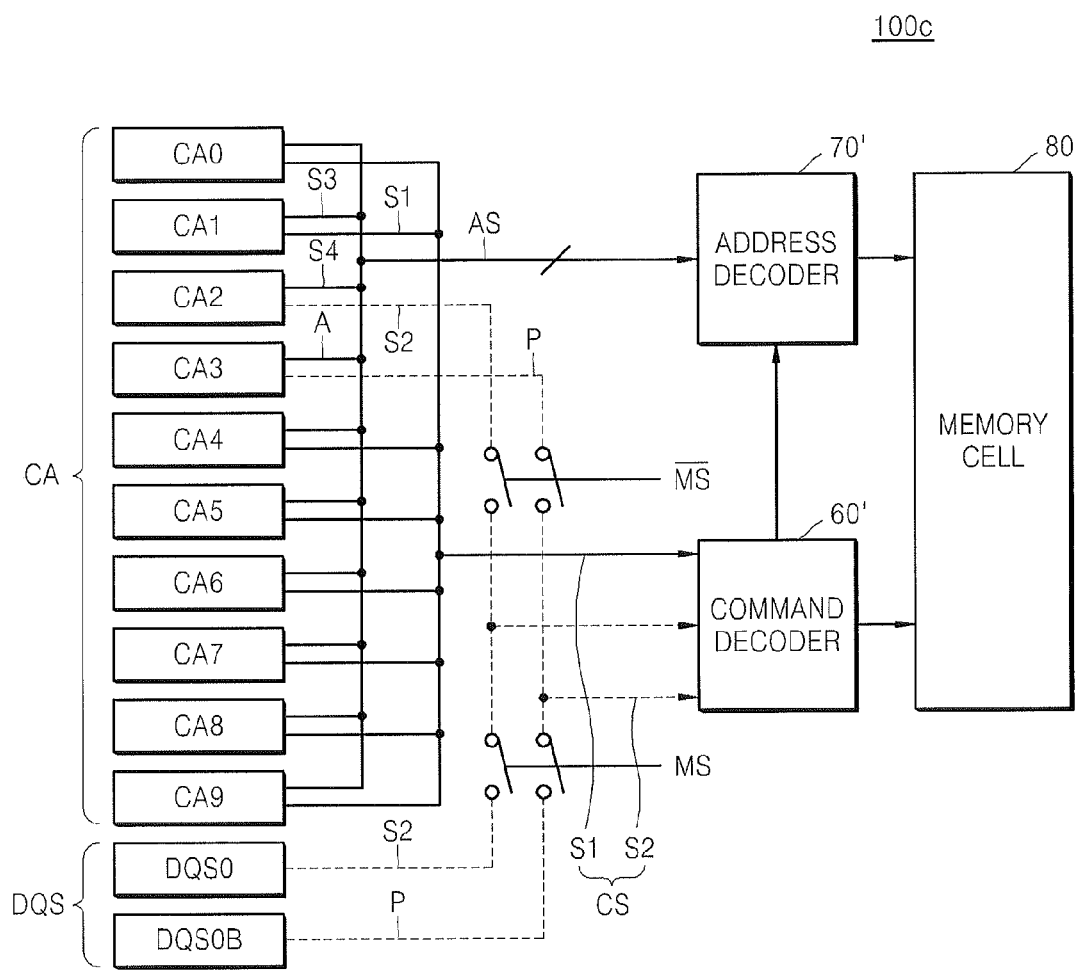
FIG. 5 is a schematic block diagram showing an exemplary embodiment of a semiconductor device, according to aspects of the inventive concept.

FIG. 5 is a schematic block diagram illustrating another exemplary embodiment of a semiconductor device 100c, according to an aspect of the inventive concept. The semiconductor device 100c may be a modified example of the semiconductor devices 100a and 100b embodiments shown in FIGS. 1 and 2, respectively. Thus, repeated description with regard to the above embodiments will be omitted.

Referring to FIG. 5, the semiconductor device 100c may be a memory device, for example, such as a dynamic random access memory (DRAM). In particular, the semiconductor device 100c may be a double data rate (DDR) DRAM. In this case, the semiconductor device 100c may include a plurality of CA pins representing command and address pins of the memory device, a plurality of DQS pins, which are data strobe pins, an address decoder 70', and a command decoder 60'. The plurality of CA pins may include 0 to nine CA pins CA0 to CA9, and the plurality of DQS pins may include a DQS pin DQS0 and a DQS pin DQS0B, in this embodiment.

For example, the DQS pins, which are used in a DDR mode, may function as dummy pins in a single data rate (SDR) mode. Thus, the semiconductor device 100c may use the DQS pins as dummy pins during a test in which the semiconductor device 100c operates in the SDR mode.

In this case, a first CA pin CA1 and a second CA pin CA2 from among the plurality of CA pins may correspond to the first connecting terminal 10 and the second connecting terminal 20 of the embodiments shown in FIGS. 1 and 2. Also, the DQS pin DQS0 may correspond to the third connecting terminal 30 of FIGS. 1 and 2, and the command decoder 60' and the address decoder 70' may correspond to the first circuit module 60 and the second circuit module 70, respectively.

Thus, the address decoder 70' may be configured to operate in response to an address signal AS from the first and second CA pins CA1 and CA2. In addition, the command decoder 60' may be configured to operate in response to a command signal CS from the first and second CA pins CA1 and CA2 when a mode signal MS is in a first state, and to operate in response to the command signal CS from the first CA pin CA1 and the DQS pin DQS0 when a mode signal MS is in a second state.

In this regard, the command signal CS may include the first signal S1 and the second signal S2. In the command signal CS, the first signal S1 may be a signal transmitted via the first CA pin CA1, and the second signal S2 may be a signal transmitted via the second CA pin CA2 or the DQS pin DQS0.

Also, the address signal AS may include the third signal S3 and the fourth signal S4. In the address signal AS, the third signal S3 may be a signal transmitted via the first CA pin CA1, and the fourth signal S4 may be a signal transmitted via the second CA pin CA2.

In this case, the command decoder 60' may be configured to operate in response to the first signal 51 from the first CA pin CA1 when a mode signal MS is in a first state, and to operate in response to the first signal S1 from the first CA pin CA1 and in response to the second signal S2 from the DQS pin DQS0 when a mode signal MS is in a second state.

The address signal AS and the command signal CS may be generated by a tester 1050 (see, e.g., FIG. 14). In this case, the tester may generate the address signal AS and the command signal CS and transmit the address signal AS and the command signal CS to the semiconductor device 100c.

Bit signals, for example, the first through fourth signals S1 through S4, which are included in the address signal AS and the command signal CS, are transmitted to the address decoder 70' and the command decoder 60' via the CA pins. The address decoder 70' and the command decoder 60' decode the bit signals and transmit the bit signals to a memory cell, and thus, a reading operation and/or a writing operation of data with respect to a specific cell disposed inside the memory cell are/is performed. Details regarding the reading and writing operations will be described with reference to FIGS. 6 through 11.

In this case, a number of pin data for each pin assigned by the tester may be more than a number of signals applied to the second CA pin CA2 during application of a mode signal MS. In detail, a number of pin data for each pin assigned by the tester may be more than a number of signals, for example, a number of the fourth signals S4, applied to the second CA pin CA2 of the address signal AS applied to the address decoder 70'. Accordingly, a test of the semiconductor device 100c may be performed by using a conventional tester having an ability to assign a smaller number of pin data.

Such a characteristic of the inventive concept may also be applied to another pin, for example, to a third CA pin CA3. In a case of the third CA pin CA3, regardless of whether a mode signal MS is in a second state, signals applied to the third CA pin CA3 of the address signal AS may be directly transmitted to the address decoder 70'. On the other hand, when the mode signal MS is in a first state, partial signals P applied to the third CA pin CA3 from among partial signals comprised of the command signal CS may be directly applied to the command decoder 60', but when the mode signal MS is in a second state, the partial signals P may be transmitted to the command decoder 60' via the DQS pin DQS0B.

Thus, the command decoder 60' may be configured to operate in response to the partial signal P from the third CA pin CA3 when a mode signal MS is in a first state, and to operate in response to the partial signal P from the DQS pin DQS0B when a mode signal MS is in a second state.

As such, when a mode signal MS is in a second state, signals corresponding to the partial signal P and applied to the conventional third CA pin CA3 may be transmitted to the command decoder 60' via the DQS pin DQS0B to perform a test of the semiconductor device 100c by using a conventional tester having an ability to assign a smaller number of pin data, as opposed to a new or custom tester having an ability to assign a larger number of pin data.

Figures 6, 7:
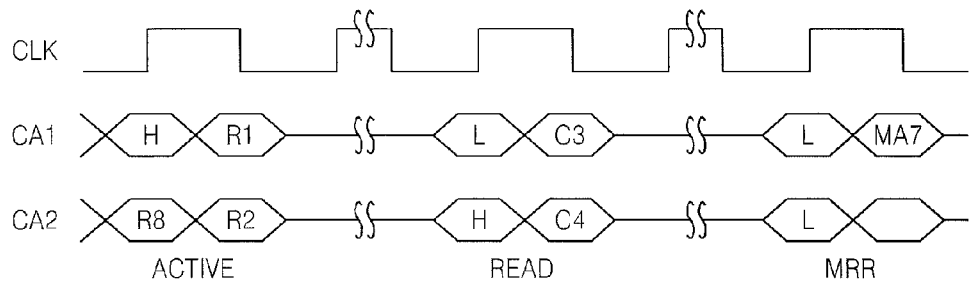
FIG. 6 is an embodiment of a timing diagram showing signals applied to a first CA pin and a second CA pin by being synchronized with a rising edge and a falling edge of a clock signal, from among the signals applied to the semiconductor device of FIG. 5, and operating characteristics of the semiconductor device, according to aspects of the inventive concept.
FIG. 7 is an embodiment of a truth table showing signals applied to each pin as signals applied to the semiconductor device of FIG. 5, according to aspects of the inventive concept.

FIG. 6 is an embodiment of a timing diagram showing signals applied to the first CA pin CA1 and the second CA pin CA2 by being synchronized with a rising edge and a falling edge of a clock signal, from among signals applied to the semiconductor device 100c of FIG. 5. FIG. 7 is an embodiment of a truth table showing signals applied to each pin, as signals applied to the semiconductor device 100c of FIG. 5, and indicating operating characteristics of the semiconductor device 100c.

In detail, the truth table of FIG. 7 shows signals applied to each pin of a DDR DRAM and operating characteristics based on a specification of a DDR DRAM published by a joint electron device engineering council (JEDEC).

Referring to FIGS. 6 and 7, a tester may perform an active operation ACTIVE, a read operation READ, and an MRR operation MRR in order to read data stored in a memory cell included in the semiconductor device 100c. In order to perform the above operations, the address signal AS for assigning a position of a specific cell in the memory cell and the command signal CS for performing a read operation should be transmitted to the address decoder 70' and the command decoder 60', respectively. The address signal AS and the command signal CS may be transmitted via the 0 to ninth CA pins CA0 to CA9 and/or the DQS pin DQS0.

In order to perform the active operation ACTIVE, the tester may apply partial signals L and H from the command signal CS and partial signals R8, R9, R10, R11, R12, BA0, BA1, and BA2 from the address signal AS to the 0 to ninth CA pins CA0 to CA9 in the rising edge of the clock signal, and may apply partial signals R0, R1, R2, R3, R4, R5, R6, R7, R13, and R14 from the address signal AS to the 0 to ninth CA pins CA0 to CA9 in the falling edge of the clock signal.

Then, in order to perform the read operation READ and the MRR operation MRR, the tester may apply partial signals of the command signal CS and the address signal AS in the rising edge and the falling edge of the clock signal. Information regarding the partial signals is described in detail in the truth table of FIG. 5, and thus a detailed description thereof will be omitted.

In particular, referring to FIGS. 6 and 7, in the first CA pin CAL first signals S1 and H from the command signal CS and third signals S3 and R1 from the address signal AS during the active operation ACTIVE are applied in the first CA pin CAL Then, the first signals S1 and L from the command signal CS and the third signals S3 and C3 from the address signal AS are applied during the read operation READ, and first signals S1 and L from the command signal CS and third signals S3 and MA7 from the address signal AS are applied during the MRR operation MRR.

Meanwhile, in the second CA pin CA2, fourth signals S4, R8, and R2 from the address signal AS are applied during the active operation ACTIVE. Then, second signals S1 and H from the command signal CS and fourth signals S4 and C4 from the address signal AS are applied during the read operation READ, and second signals S2 and L from the command signal CS are applied during the MRR operation MRR.

FIGS. 8 and 9 are embodiments of tables showing signals synchronized with a clock signal for each pin according to whether a mode signal MS is in a second state. FIGS. 10 and 11 are tables showing signals applied to the first CA pin, the second CA pin CA2, and the DQS pin DQS0 from among the pins.

That is, FIGS. 8 and 10 show operations of the semiconductor device 100c of FIG. 5 when the mode signal MS is in a first state, and FIGS. 9 and 11 show operations of the semiconductor device 100c of FIG. 5 when the mode signal MS is in a second state. Hereinafter, repeated description with regard to the semiconductor device 100c will be omitted.

Referring to FIGS. 8 and 10, when a mode signal MS is in a first state, the tester may apply second signals S2(L/H) and S2(L/H), which are synchronized with second and third rising edges of the clock signal and comprise the command signal CS, and fourth signals S4, R8, R2, C4, and OP0, which comprise the address signal AS, to the second CA pin CA2. In this case, the tester should assign a total of six pin data, that is, R8, R2, L/H, C4, L/H, and OP0, to the second CA pin CA2. Thus, it is impossible to perform a test of the semiconductor device 100c by using a conventional tester having an ability to assign less than six pin data.

However, referring to FIGS. 9 and 11, when a mode signal MS is in a second state, the tester may apply only fourth signals S4, R8, R2, C4, OP0, which comprise the address signal AS, to the second CA pin CA2, and may apply second signals S2(L/H) and S2(L/H), which are synchronized with second and third rising edges of the clock signal and comprise the command signal CS, to the DQS pin DQS0. In this case, the tester may assign only four fourth signals S4, that is, a total of four pin data to the second CA pin CA2. Accordingly, a test of the semiconductor device 100c may be performed by using a conventional tester having an ability to assign less than six pin data, for example, a tester having an ability to assign four or five pin data.

Referring to FIGS. 8 through 11, in a case of the first CA pin CA1, regardless of whether a mode signal MS is in a second state, first signals S1(L/H) and S1(L/H), which are synchronized with first through third rising edges of the clock signal and comprise the command signal CS, and the third signals S3 R1, C3, and MA7, which comprise the address signal AS, are applied to the first CA pin CA1. That is, in this case, the inventive concept has not been applied to the first CA pin CA1.

Meanwhile, referring to FIGS. 8 and 9, the inventive concept may be applied to a third CA pin CA3. In other words, a number of signals applied to the third CA pin CA3 may be changed.

When a mode signal MS is in a first state, the tester may apply a partial signal L/H, which is synchronized with a third rising edge of the clock signal and comprises the command signal CS, and partial signals R9, R3, C0, C5, and OP1, comprising the address signal AS, to the third CA pin CA3. In this case, the tester should assign a total of six pin data, that is, R9, R3, C0, C5, L/H, and OP1 to the third CA pin CA3. Accordingly, it is impossible to perform a test of the semiconductor device 100c by using a conventional tester having an ability to assign less than six pin data.

However, when a mode signal MS is in a second state, the tester may apply only the partial signals R9, R3, C0, C5, and OP1, which comprises the address signal AS, to the third CA pin CA3, and may apply the partial signal L/H, which is synchronized with the third rising edge of the clock signal and comprises the command signal CS, to the DQS pin DQS0B.

In this case, the tester may assign partial signals related to an address, that is, a total of five pin data to the third CA pin CA3. Accordingly, a test of the semiconductor device 100c may be performed by using a conventional tester having an ability to assign less that pin data, for example, a tester having an ability to assign five pin data.

Although, in FIGS. 5 through 11, the inventive concept is described in terms of the command signal CS, the address signal AS, the CA pins, and the DQS pins, the inventive concept is not limited thereto. That is, the inventive concept is not limited to a memory, and may be applied to a case when a test of a device to be tested is performed by using a conventional tester having an ability to assign a small number of pin data. Also, the inventive concept may be applied to any case when a part of a multi-operation function is divided into other pins in a specific mode, that is, when a mode signal MS is in a second state.

Figure 12:
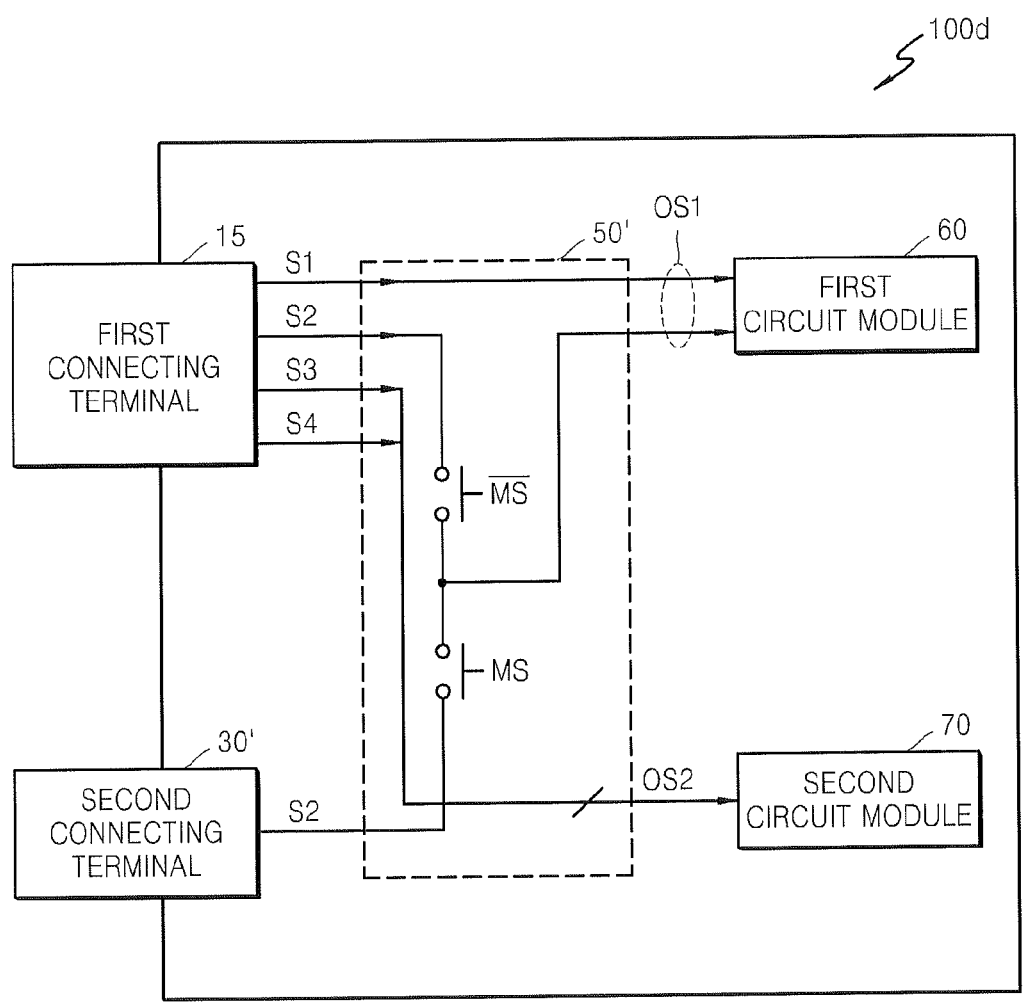
FIG. 12 is a schematic block diagram showing another exemplary embodiment of a semiconductor device, according to another aspect of the inventive concept.

FIG. 12 is a schematic block diagram showing an embodiment of a semiconductor device 100d, according to another aspect of the inventive concept. The semiconductor device 100d is a modified example of the semiconductor devices 100a and 100b embodiments shown in FIGS. 1 and 2. Thus, repeated description with regard to the above embodiments will be omitted.

Referring to FIG. 12, the semiconductor device 100d may include a plurality of first connecting terminals 15, one or more second connecting terminals 30', a first circuit module 60, and a second circuit module 70.

As described above, the first circuit module 60 may be configured to operate by receiving a first operating signal OS1 including a first signal S1 and a second signal S2, and the second circuit module 70 may be configured to operate by receiving a second operating signal OS2 including a third signal S3 and a fourth signal S4.

Also, the plurality of first connecting terminals 15 may correspond to the first connecting terminal 10 and the second connecting terminal 20 of FIGS. 1 and 2, and the second connecting terminal 30' may correspond to the third connecting terminal 30 of FIGS. 1 and 2.

When a mode signal MS is in a first state, the first circuit module 60 and the second circuit module 70 may receive first through fourth signals 51 through S4 from the first connecting terminals 15.

Otherwise, when a mode signal MS is in a second state, the second circuit module 70 may receive third and fourth signals S3 and S4 from the first connecting terminals 15, and the first circuit module 60 may receive the first signal S1 from the first connecting terminals 15, and the second signal S2 from the second connecting terminal 30'.

In order to perform signal distribution, the semiconductor device 100d may further include a signal distribution unit 50'. In various embodiments, the signal distribution unit 50' may be configured in the first circuit module 60 or the second circuit module 70.

In operation, the signal distribution unit 50' may operate in a similar manner to the signal distribution unit 50 of FIGS. 1 and 2. That is, the signal distribution unit 50' may be configured to selectively provided second signal S2 to the first circuit module 60, from either the first connecting terminal 15 or the second connecting terminal 30,' depending on the mode indicated to the mode signal MS. The first signal S1 can be provided to the first circuit module 60 directly, or via the signal distribution unit 50'. And the third and fourth signals S3 and S4 can be provided to the second circuit module 70 directly, or via the signal distribution unit 50'.

Figure 13:
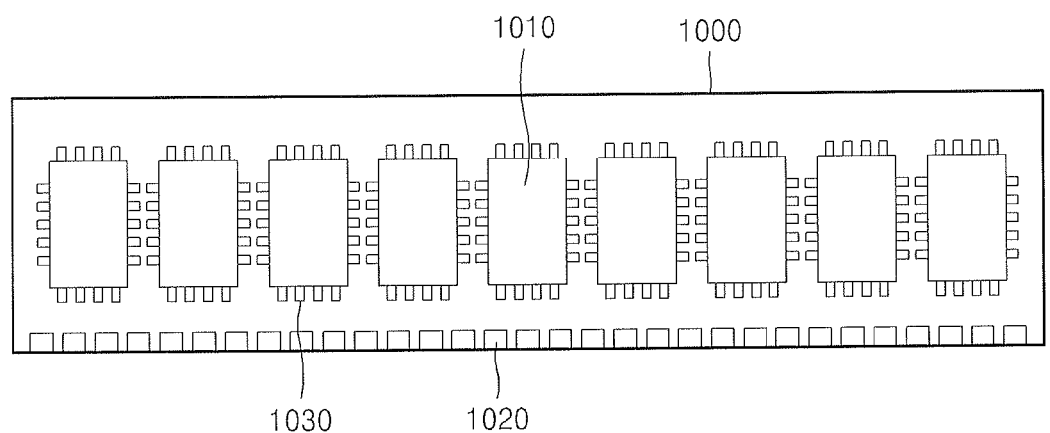
FIG. 13 is a plan view showing an exemplary embodiment of a memory module including a memory device, according to aspects of the inventive concept.

FIG. 13 is a plane view showing an embodiment of a memory module 1000 including a memory device, according to aspects of the inventive concept.

Referring to FIG. 13, the memory module 1000 may include a plurality of memory packages 1010 and a plurality of external system contacts 1020. The plurality of memory packages 1010 each may include the semiconductor devices 100a through 100d in accordance with the above embodiments. Each of the external system contacts 1020 may be electrically connected to connecting terminals 1030, e.g., CA pins, of the semiconductor devices 100a through 100d in each memory package 1010. The external system contacts 1020 may be connected to a computing system (not shown) to transmit command signals CS and address signals AS from the computing system to the memory packages 1010. Also, the external system contacts 1020 may be used to transmit data signals stored in the semiconductor devices 100a through 100d included in each memory package 1010 to the computing system.

FIG. 14 is a block diagram showing an embodiment of a functional arrangement for testing the memory module 1000 using a tester 1050, according to aspects of the inventive concept.

Referring to FIG. 14, the tester 1050 may apply a command signal CS and an address signal AS to the memory module 1000 to perform operations for reading data stored in a memory cell included in the memory module 1000 or for writing data in the memory cell.

For example, the tester 1050 may perform an operation for storing data in the memory cell and then perform an operation for reading the data. In this case, the tester 1050 may compare the data read out with expected data to obtain a test result.

However, operations for writing data to the memory cell and reading data from the memory cell are performed with respect to a plurality of data cells. Accordingly, by using a pattern generator (not shown) included in the tester 1050, the tester 1050 may generate a command signal CS and an address signal AS including a plurality of partial signals according to a predetermined pattern, as discussed above. The generated command signal CS and the address AS signal are applied to the memory module 1000, and thus the reading and writing operations are performed. In order to generate the command signal CS and the address signal AS, a tester may have information regarding a truth table representing operations of a semiconductor device, as discussed above.

For example, when the tester 1050 is activated to perform a reading operation by generating partial signals of the command signal CS and the address signal AS according to the truth table shown in FIG. 6, the tester 1050 may perform an active operation ACTIVE, a read operation READ, and an MRR operation MRR on the second CA pin CA2, as shown in FIG. 7. For this, the tester 1050 should assign five types of pin data, i.e., R8, R2, H, C4, and L. Therefore, the tester 1050 must be a tester having an ability to assign at least five pin data.

However, when a semiconductor device is tested according to the inventive concept, as a mode signal MS is in a second state, partial signals of a command signal CS of the second CA pin CA2 are transmitted via another pin by a circuit configured in the signal distribution unit 50 of FIG. 1 or the first circuit module 60 of FIG. 1, and thus a test of the semiconductor device may be performed by using the tester 1050, which has an ability to assign a smaller number of pin data, for example, three pin data.

Figure 15:
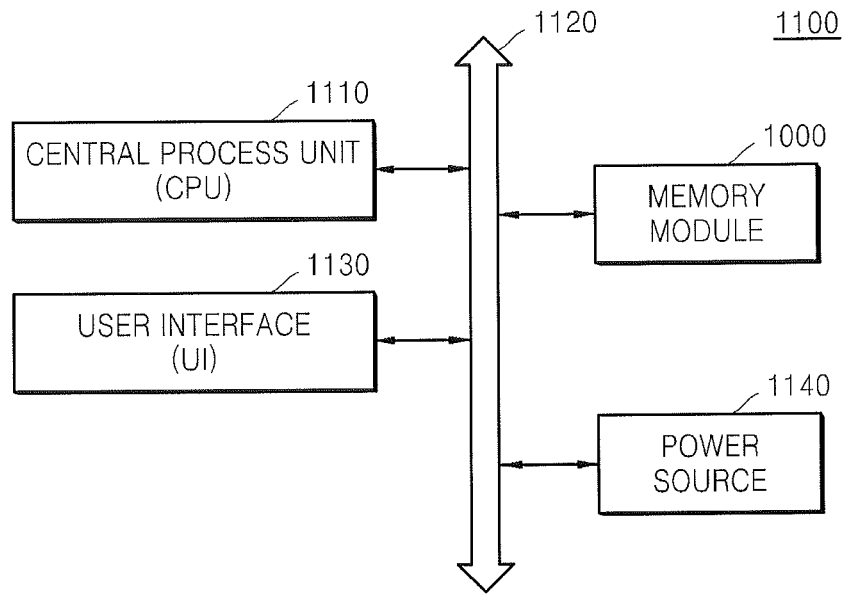
FIG. 15 is a block diagram showing an exemplary embodiment of a computing system including a memory module, according to aspects of the inventive concept.

FIG. 15 is a block diagram showing an embodiment of a computing system 1100 including the memory module 1000 of FIG. 3, according to aspects of the inventive concept.

Referring to FIG. 15, the computing system 1100 may include a central process unit (CPU) 1110, a user interface (UI) 1130, a power source 1140, and the memory module 1000.

The memory module 1000 is electrically connected to the CPU 1110, the user interface 1130, and the power source 1140 via a system bus 1120. Data provided via the user interface 1130 or processed via the CPU 1110 is stored in the memory module 1000. Although not shown in FIG. 15, the computing system 1100 according to the inventive concept may further include an application chipset, a camera image processor, etc.

The above semiconductor device embodiments according to the inventive concept may decode test signals through an integrated circuit formed therein. Accordingly, even though a conventional apparatus having a limited ability to assign pin data for each channel is used, tests of the semiconductor devices may be performed by distributing the test signals by the integrated circuit. Consequently, since there is no need for an additional tester, cost reduction may be achieved.

Figure 16:
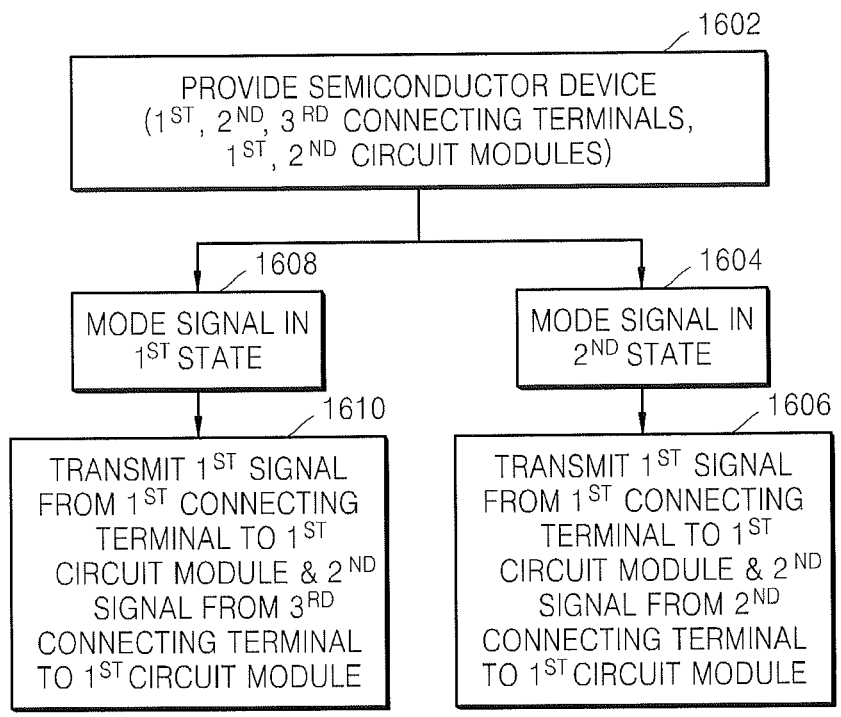
FIG. 16 provides an embodiment of a method of distributing test signals in a semiconductor device, according to aspects of the inventive concept.

FIG. 16 provides an embodiment of a method of distributing test signals in a semiconductor device, according to aspects of the inventive concept. Method 1600 can be implemented with any of the above described semiconductor device embodiments, e.g., semiconductor devices 110, a, 100b, 100c, and 100d, or the like.

According to method 1600, a semiconductor device can be provided that includes a first connecting terminal, a second connecting terminal, a third connecting terminal, a first circuit module, and a second circuit module, as in step 1602. A mode signal can be applied. When the mode signal is in a first state, in step 1604, a first signal is transmitted from the first connecting terminal to the first circuit module and a second signal is transmitted from the second connecting terminal to the first circuit module, in step 1606. And when the mode signal is in a second state, in step 1608, the first signal is transmitted from the first connecting terminal to the first circuit module and the second signal is transmitted from the third connecting terminal to the first circuit module, in step 1610.

Method 1600 can be implemented by tester 1050 in FIG. 12 when connected to a memory module that includes such semiconductor memory devices. In such a case, the tester 1050 can generate the first and second signals. A signal distribution unit can be provided that is responsive to the mode signal for transmitting the second signal from the second connecting terminal or third connecting terminal to the first circuit module, depending on the state of the mode signal.

The foregoing exemplary embodiments are illustrative, and are not to be construed as limiting of the inventive concept. Although exemplary embodiments have been described, those of ordinary skill in the art will readily appreciate that many modifications are possible without materially departing from the novel teachings and advantages of the inventive concept. Accordingly, all such modifications are intended to be included within the scope of the claims.

What is claimed is:

1. A semiconductor device comprising:
a first connecting terminal;
a second connecting terminal;
a third connecting terminal; and
a first circuit module configured to operate in response to a first operating signal comprising a first signal and a second signal;
a second circuit module configured to operate in response to a second operating signal comprising a third signal and a fourth signal; and
a signal distribution unit configured to:
transmit the first signal from the first connecting terminal to the first circuit module and the second signal from the second connecting terminal to the first circuit module when a mode signal is in a first state, and
transmit the first signal from the first connecting terminal to the first circuit module and the second signal from the third connecting terminal to the first circuit module when the mode signal is in a second state,
wherein the second circuit module is configured to receive the third signal from the first connecting terminal and receive the fourth signal from the second connecting terminal, and
wherein N (N≥2) signals comprising the second signal and the fourth signal are applied to the second connecting terminal when the mode signal is in the first state, while N−1 signals comprising the fourth signal are applied to the second connecting terminal when the mode signal is in the second state.

2. The semiconductor device of claim 1, wherein the semiconductor device is configured to be tested by a tester having an ability to assign N−1 pin data to a connecting terminal, and N−1 test signals corresponding to the N−1 pin data are applied to the second connecting terminal when the mode signal is in the second state.

3. The semiconductor device of claim 1, wherein the first circuit module is a command decoder configured to operate in response to a command signal corresponding to the first operating signal.

4. The semiconductor device of claim 3, wherein the command decoder is configured to operate in response to the command signal when received from the first connecting terminal and the second connecting terminal when the mode signal is in a first state and to operate in response to the command signal when received from the first connecting terminal and the third connecting terminal when the mode signal is in a second state.

5. The semiconductor device of claim 1, wherein the second circuit module is an address decoder configured to operate in response to an address signal corresponding to the second operating signal.

6. The semiconductor device of claim 1, wherein the signal distribution unit is configured inside the first circuit module, and
wherein the signal distribution unit is configured to electrically connect the first connecting terminal, the second connecting terminal, and the first circuit module when a mode signal is in a first state, and electrically connect the third connecting terminal and the first circuit module when the mode signal is in a second state.

7. The semiconductor device of claim 1, wherein the first signal and the second signal are synchronized with a clock signal applied to the first circuit module.

8. The semiconductor device of claim 7, wherein the first signal and the second signal are synchronized with a rising edge or a falling edge, respectively, of the clock signal applied to the first circuit module.

9. A memory module including a plurality of semiconductor devices, at least one or the semiconductor devices comprising:
a first connecting terminal;
a second connecting terminal;
a third connecting terminal;
a first circuit module configured to operate in response to a first operating signal comprising a first signal and a second signal;

a second circuit module configured to operate in response to a second operating signal comprising a third signal and a fourth signal; and a signal distribution unit configured to transmit signals received from the first connecting terminal, the second connecting terminal, and the third connecting terminal to the first circuit module, wherein the signal distribution unit is further configured to:

electrically connect the second connecting terminal and the first circuit module when a mode signal is in a first state, and electrically connect the third connecting terminal and the first circuit module when the mode signal is in a second state, wherein the second circuit module is configured to receive the third signal from the first connecting terminal and receive the fourth signal from the second connecting terminal, and wherein N (N≥2) signals comprising the second signal and the fourth signal are applied to the second connecting terminal when the mode signal is in the first state, while N−1 signals comprising the fourth signal are applied to the second connecting terminal when the mode signal is in the second state.

10. The semiconductor device of claim 9, wherein the first circuit module is a command decoder configured to operate in response to a command signal corresponding to the first operating signal.

11. The semiconductor device of claim 10, further comprising an address decoder configured to operate in response to an address signal corresponding to the second operating signal.

12. The semiconductor device of claim 10, wherein when the mode signal is in a first state, the command decoder is configured to operate in response to the command signal when received from the first connecting terminal and the second connecting terminal, and when the mode signal is in a second state, the command decoder is configured to operate in response to the command signal when received from the first connecting terminal and the third connecting terminal.

13. A method of distributing test signals in a semiconductor device, comprising:

providing a semiconductor device including a first connecting terminal, a second connecting terminal, a third connecting terminal, a first circuit module, and a second circuit module; and when a mode signal is in a first state, transmitting a first operating signal comprising a first signal and a second signal to the first circuit module, the first signal through the first connecting terminal and the second signal through the second connecting terminal, and when the mode signal is in a second state, transmitting the first signal through the first connecting terminal to the first circuit module and the second signal through the third connecting terminal to the first circuit module, transmitting a second operating signal comprising a third signal and a fourth signal to the second circuit module, the third signal through the first connecting terminal and the fourth signal through the second connecting terminal, wherein N (N>=2) signals comprising the second signal and the fourth signal are applied to the second connecting terminal when the mode signal is in the first state, while N−1 signals comprising the fourth signal are applied to the second connecting terminal when the mode signal is in the second state.

14. The method of claim 13, wherein the method comprises synchronizing the first signal and the second signal with a clock signal applied to the first circuit module.

15. The method of claim 14, further comprising synchronizing the first signal and the second signal with a rising edge or a falling edge, respectively, of the clock signal applied to the first circuit module.

16. The method of claim 13, including testing the semiconductor device using a tester having an ability to assign N−1 pin data to a connecting terminal, the method further comprising the tester:

applying N−1 test signals corresponding to the N−1 pin data to the second connecting terminal when the mode signal is in the second state.

17. The method of claim 13, wherein the first circuit module is a command decoder configured to operate in response to a command signal corresponding to the first operating signal.

18. The method of claim 17, wherein the second circuit module comprises an address decoder configured to operate in response to an address signal corresponding to the second operating signal.

* * * * *